United States Patent [19]

Evans, Jr. et al.

[11] Patent Number: 5,789,775
[45] Date of Patent: Aug. 4, 1998

[54] HIGH DENSITY MEMORY AND DOUBLE WORD FERROELECTRIC MEMORY CELL FOR CONSTRUCTING THE SAME

[75] Inventors: Joseph T. Evans, Jr.; Richard Womack, both of Albuquerque, N. Mex.

[73] Assignee: Radiant Technologies, Alburquerque, N. Mex.

[21] Appl. No.: 592,629

[22] Filed: Jan. 26, 1996

[51] Int. Cl.$^6$ .................................. H01L 29/792
[52] U.S. Cl. .............................. 257/295; 365/145
[58] Field of Search ...................... 257/295; 365/145

[56] References Cited

U.S. PATENT DOCUMENTS

| | | | |
|---|---|---|---|
| 5,412,596 | 5/1995 | Hoshiba | 365/145 |
| 5,471,417 | 11/1995 | Krautschneider et al. | 364/145 |
| 5,508,954 | 4/1996 | Mihara et al. | 365/145 |
| 5,546,352 | 8/1996 | Nakane et al. | 365/189.01 |
| 5,654,568 | 8/1997 | Nakao | 257/324 |

Primary Examiner—Donald Monin
Attorney, Agent, or Firm—Calvin B. Ward

[57] ABSTRACT

A high density non-volatile ferroelectric-based memory based on a ferroelectric FET operated in a two terminal write mode. Storage words may be constructed either from one or two bit storage cells based on a ferroelectric FET. A memory using either the one or two bit storage cells includes a plurality of word storage cells organized into a rectangular array including a plurality of columns and rows. Each of the word storage cells includes N single bit memory cells. Each of the single bit memory cells includes a pass transistor and a ferroelectric storage element. All of the gate electrodes in the circuit are connected to a common gate electrode, and all of the source electrodes are connected to a common source electrode. If the memory is built from two bit storage cells as described herein, each storage cell is one half of a two bit storage cell. All of the common source electrodes in each one of the columns are connected electrically to a column electrode corresponding to that column and all of the pass gates in each of the rows are connected electrically to a row electrode corresponding to that row. A memory address includes a plurality of bits divided into first and second groups of bits. The column and row electrodes are selected by the first and second groups of bits, respectively.

7 Claims, 8 Drawing Sheets

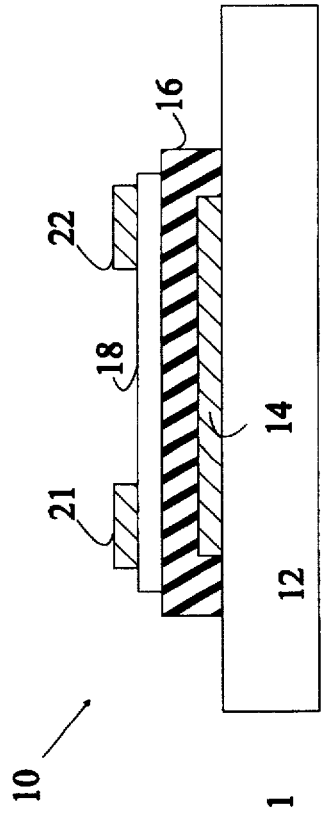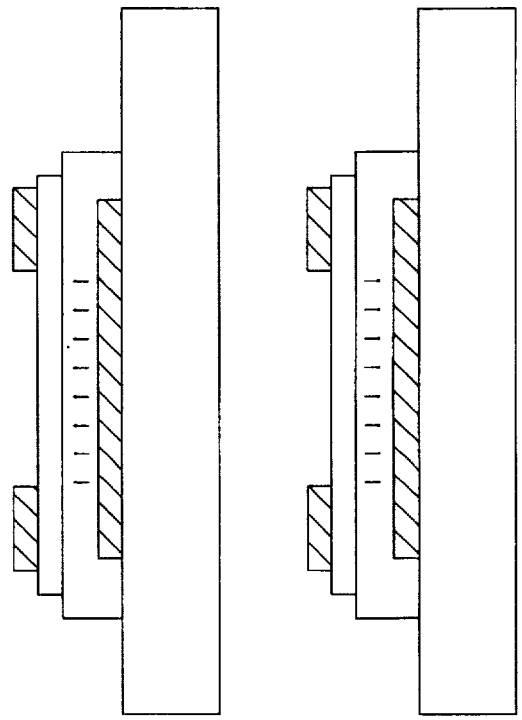

HIGH DENSITY MEMORY AND DOUBLE WORD FERROELECTRIC MEMORY CELL FOR CONSTRUCTING THE SAME

FIELD OF THE INVENTION

The present invention relates to static memory cells, and more particularly, to an improved memory based on ferroelectric field effect transistors (FETs).

BACKGROUND OF THE INVENTION

U.S. Pat. No. 5,070,385 describes a ferroelectric FET that may be used for constructing memory cells that retain their data even when power is removed from the cell. The memory cell consists of a semiconductor layer that overlies a ferroelectric layer. The direction of polarization of the underlying ferroelectric layer determines the electric field in which the semiconductor layer functions. Data is stored in the direction of polarization of the ferroelectric layer. The data is sensed by measuring the resistivity of the semiconductor layer between two electrodes that are analogous to the source and drain in a conventional FET. The polarization of the underlying FET layer is set by applying voltages across the ferroelectric layer. These voltages are applied with the aid of a third electrode which is analogous to the gate of a conventional FET.

The greatest differences in resistivity between the two possible directions of polarization are obtained by applying the same voltage to the source and drain and a different voltage to the gate. This mode of operation requires that all three terminals be operated separately. As a result, the circuit area needed to construct a memory based on this mode of operation is substantially greater than the area needed for the ferroelectric FETs due to the need to run three separate lines to each memory cell. Hence, while the three terminal operation provides the greatest difference between the resistivities corresponding to the two possible data states, it is less than optimum in terms of cell density in a practical memory.

The smallest cell size is achieved in a mode in which the source is shorted to the gate. In this mode, only two lines need to be run to each cell. Unfortunately, the connection between the gate and source requires that a via be etched through the ferroelectric layer to provide the connection between the gate and source which lie on opposite sides of the ferroelectric layer. This via substantially increases the cell area.

Another problem that limits the density of ferroelectric FET based memories is the space needed between memory words for drive circuitry. The drive circuitry consists of two transistors to drive the source/gate and two transistors to select the word. The area needed to construct one set of drivers per memory word can represent a significant fraction of the total memory array area.

Broadly, it is the object of the present invention to provide an improved ferroelectric FET memory cell.

It is a further object of the present invention to provide a ferroelectric FET that operates in the two terminal mode without requiring separate connections between the gates and sources of each ferroelectric FET.

It is a still further object of the present invention to provide a memory design which requires substantially less area per word than that required by connecting separate ferroelectric FET cells.

It is yet another object of the present invention to provide a memory design in which individual drivers are not needed for each word of memory.

These and other objects of the present invention will become apparent to those skilled in the art from the following detailed description of the invention and the accompanying drawings.

SUMMARY OF THE INVENTION

The present invention is an improved ferroelectric based memory system constructed from memory circuits that store either one or two bits of data. A circuit for storing a word based on single bit memory cells includes N single bit memory cells, wherein N>2. Each of the single bit memory cells includes a pass transistor and a ferroelectric FET. The pass transistor includes a pass gate and first and second terminals, the pass transistor providing a conducting path between the first and second terminals in response to the pass gate being coupled to a predetermined potential. A ferroelectric FET includes a gate electrode, a layer of ferroelectric material, a layer of semiconducting material, a source electrode and a drain electrode. The layer of ferroelectric material is sandwiched between the gate electrode and the layer of semiconducting material. The source and drain electrodes are in contact with the layer of semiconducting material. The drain electrode of the ferroelectric FET is connected to the first terminal of the pass transistor. All of the gate electrodes in the circuit are connected to a common gate electrode, and all of the source electrodes are connected to a common source electrode. The common gate electrode and the common source electrode are connected electrically at less than N points in the circuit.

In one embodiment of the present invention, the ferroelectric layer in each of the single bit memory cells is a portion of a common ferroelectric layer that is shared by all of the ferroelectric FETs. The ferroelectric layer in each of the ferroelectric FETs occupies a portion of the common ferroelectric layer with a portion of the ferroelectric layer between the ferroelectric FETs being unoccupied. The common gate electrode and the common source electrode are conducting layers in contact with the common ferroelectric layer in the unoccupied regions, and the common source electrode overlies the common gate electrode in the unoccupied regions. This arrangement increases the capacitive coupling between the common electrodes.

A circuit for storing two words includes the N two bit memory cells, where N>2. Each of the two bit memory cells includes first and second pass transistors and a two bit ferroelectric storage cell. Each of the pass transistors includes a pass gate and first and second terminals, the pass transistor providing a conducting path between the first and second terminals in response to the pass gate being coupled to a predetermined potential. The two bit ferroelectric storage cell includes a gate electrode, a layer of ferroelectric material, layer of semiconducting material, a source electrode and first and second drain electrodes. The layer of ferroelectric material is sandwiched between the gate electrode and the layer of semiconducting material. The source and drain electrodes are in contact with the layer of semiconducting material. The first drain electrode of the two bit ferroelectric storage cell is connected to the first terminal of the first pass transistor, and the second drain electrode of the two bit ferroelectric storage cell is connected to the first terminal of the second pass transistor. All of the gate electrodes in the circuit are connected to a common gate electrode, and all of the source electrodes are connected to a common source electrode. The common gate and source electrodes are connected together.

In one embodiment of the present invention, the ferroelectric layer in each two bit ferroelectric storage cell includes a portion of a common ferroelectric layer that is shared by all of the two bit ferroelectric storage cells. Each ferroelectric layer in a two bit ferroelectric storage cell occupies a portion of the common ferroelectric layer with a portion of the ferroelectric layer between the ferroelectric FETs being unoccupied. The common gate electrode and the common source electrode are conducting layers in contact with the common ferroelectric layer in the unoccupied regions, and the common source electrode overlies the common gate electrode in the unoccupied regions.

A memory using either the one or two bit storage cells includes a plurality of word storage cells organized into a rectangular array including a plurality of columns and rows. Each of the word storage cells includes N single bit memory cells, wherein N>2. Each of the single bit memory cells includes a pass transistor and a ferroelectric storage element. The pass transistor includes a pass gate and first and second terminals. The pass transistor provides a conducting path between the first and second terminals in response to the pass gate being coupled to a predetermined potential.

The ferroelectric storage element includes a gate electrode, a layer of ferroelectric material, a layer of semiconducting material, a source electrode and a drain electrode. The layer of ferroelectric material is sandwiched between the gate electrode and the layer of semiconducting material. The source and drain electrodes are in contact with the layer of semiconducting material. The drain electrode of the ferroelectric storage element is connected to the first terminal of the pass transistor. All of the gate electrodes in the circuit are connected to a common gate electrode, and all of the source electrodes are connected to a common source electrode. If the memory is built from two bit storage cells as described above, each storage cell described here is one half of a two bit storage cell.

All of the common source electrodes in each one of the columns are connected electrically to a column electrode corresponding to that column and all of the pass gates in each of the rows are connected electrically to a row electrode corresponding to that row. The memory preferably includes an address register for receiving an address including a plurality of bits divided into first and second groups of bits. A column decoder selects one of the column electrodes, the selection depending on the first group of bits. A row decoder selects one of the row electrodes, the selection depending on the second group of bits.

BRIEF DESCRIPTION OF THE DRAWINGS

FIG. 1 is a cross-sectional view of a ferroelectric FET.

FIG. 2 illustrates one of the polarization patterns produced in a ferroelectric FET when data is written by connecting the source and drain.

FIG. 3 illustrates the other polarization pattern produced by writing data in a ferroelectric FET with the source and drain connected together.

DETAILED DESCRIPTION OF THE INVENTION

Figures 4, 5:
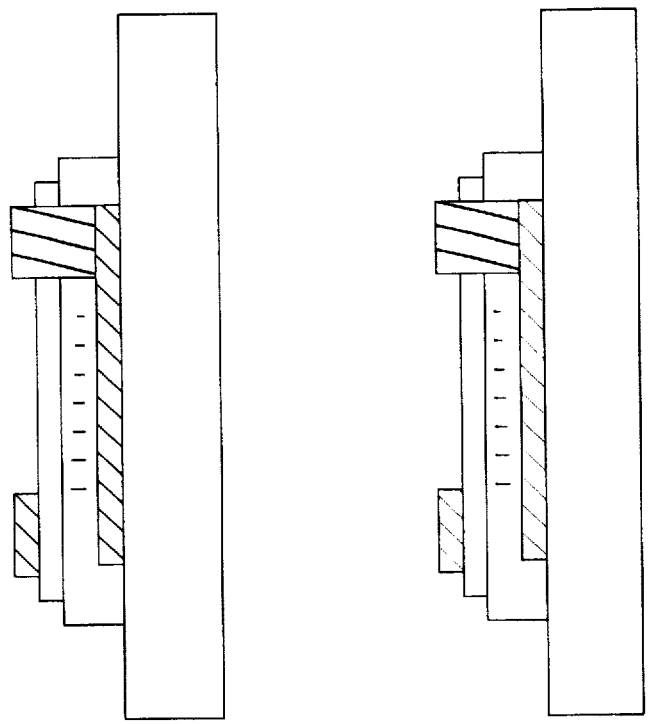
FIG. 4 illustrates one of the polarization patterns produced in a ferroelectric FET when data is written by connecting the source and gate.
FIG. 5 illustrates the other polarization pattern produced by writing data in a ferroelectric FET with the source and gate connected together.

The present invention may be more easily understood with reference to FIG. 1 which is a cross-sectional view of a ferroelectric FET 10. Ferroelectric FET 10 is constructed on a substrate 12 by first depositing the gate electrode 14. The ferroelectric layer 16 is then deposited over the gate electrode and etched to the appropriate size. The semiconductor layer 18 is then deposited on the ferroelectic layer and two electrodes 21 and 22 corresponding to the source and drain are deposited on semiconductor layer 18. The choice of which electrode is labeled as the "source" is arbitrary.

As noted above, data is stored in ferroelectric FET 10 by setting the direction of polarization of ferroelectric layer 16. In three terminal operation, the direction of polarization is set by applying a potential difference across ferroelectric layer 16 using a circuit that holds the source and drain at the same potential. For example, the polarization of the ferroelectric layer may set in one direction by applying 5 volts to the source and drain while holding the gate at ground. The opposite state is set by holding the source and drain at ground and applying a potential of 5 volts to the gate. It should be noted that this write scheme results in the direction and magnitude of the polarization of the ferroelectric layer being the same at all points between the source and the drain as shown in FIGS. 2 and 3 which illustrate the polarization of the ferroelectric layer in each of the two data states, respectively.

As pointed out above, this mode of operating the memory cell requires that separate conductors be run to each of the electrodes on the memory cell, and hence, the area required to construct a word of memory is substantially greater than the area occupied by ferroelectric FETs of that word. A substantial reduction in word area can be achieved by operating the memory in a two terminal mode in which the source of each ferroelectric FET is connected to the gate of that ferroelectric FET. The polarization of the ferroelectric layer in this mode is more complex than that shown in FIGS. 2 and 3. Since the gate and drain are connected to the same potential, no potential difference is generated across the portion of the ferroelectric layer under the source. The potential difference between the portion of the ferroelectric layer under the source can be switched from fully up to fully down as shown in FIGS. 4 and 5. The magnitude of the polarization at the intermediate points between the source and drain is less than that obtained in three terminal operation because the potential at each point is reduced by the voltage drop from the source to the point in question along the semiconductor layer. The resultant polarization is a complex function that depends on the hysteresis curve of the ferroelectric material in the ferroelectric layer.

Figure 6:
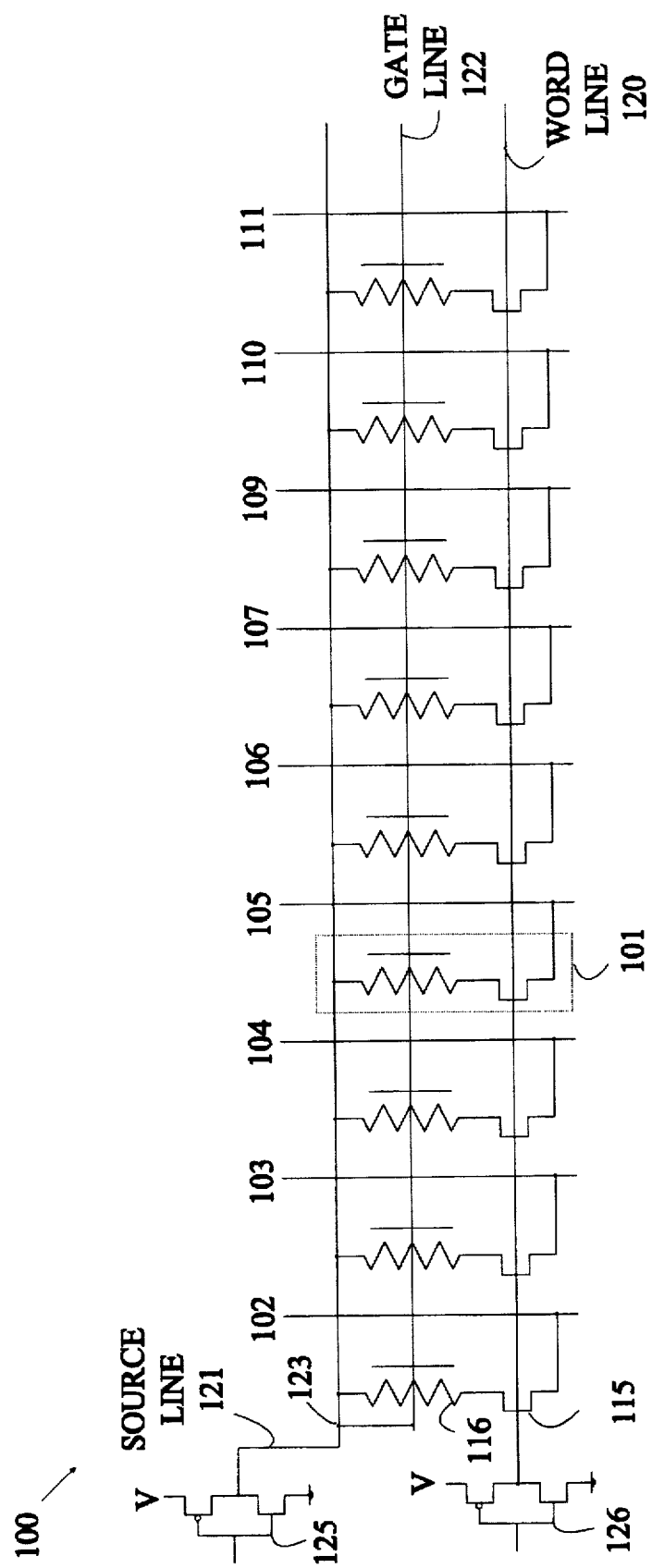
FIG. 6 is a schematic drawing of a one word memory cell according to the present invention.

Refer now to FIG. 6 which is a schematic drawing of a one word memory cell 100 according to the present invention. Memory cell 100 has nine single bit storage cells of which storage cell 101 is typical. Each storage cell includes a ferroelectric FET 116 and a pass transistor 115. Each storage cell connects a source line 121 to one of the bit lines.

The bit lines are shown at 102–111. As noted above, the minimum cell area is achieved by connecting all of the gates of the ferroelectric FETs to a common gate line 122 and all of the sources of the ferroelectric FETs to a common source line 121. The source line and gate line are then connected via a single via at the end of the word as shown at 123. This arrangement eliminates the need to connect each source to each gate separately through a via. The actual location of the connection is a matter of design choice. In the preferred embodiment of the present invention, it is made at one end of the word to minimize the area needed for the connection.

Figure 7:
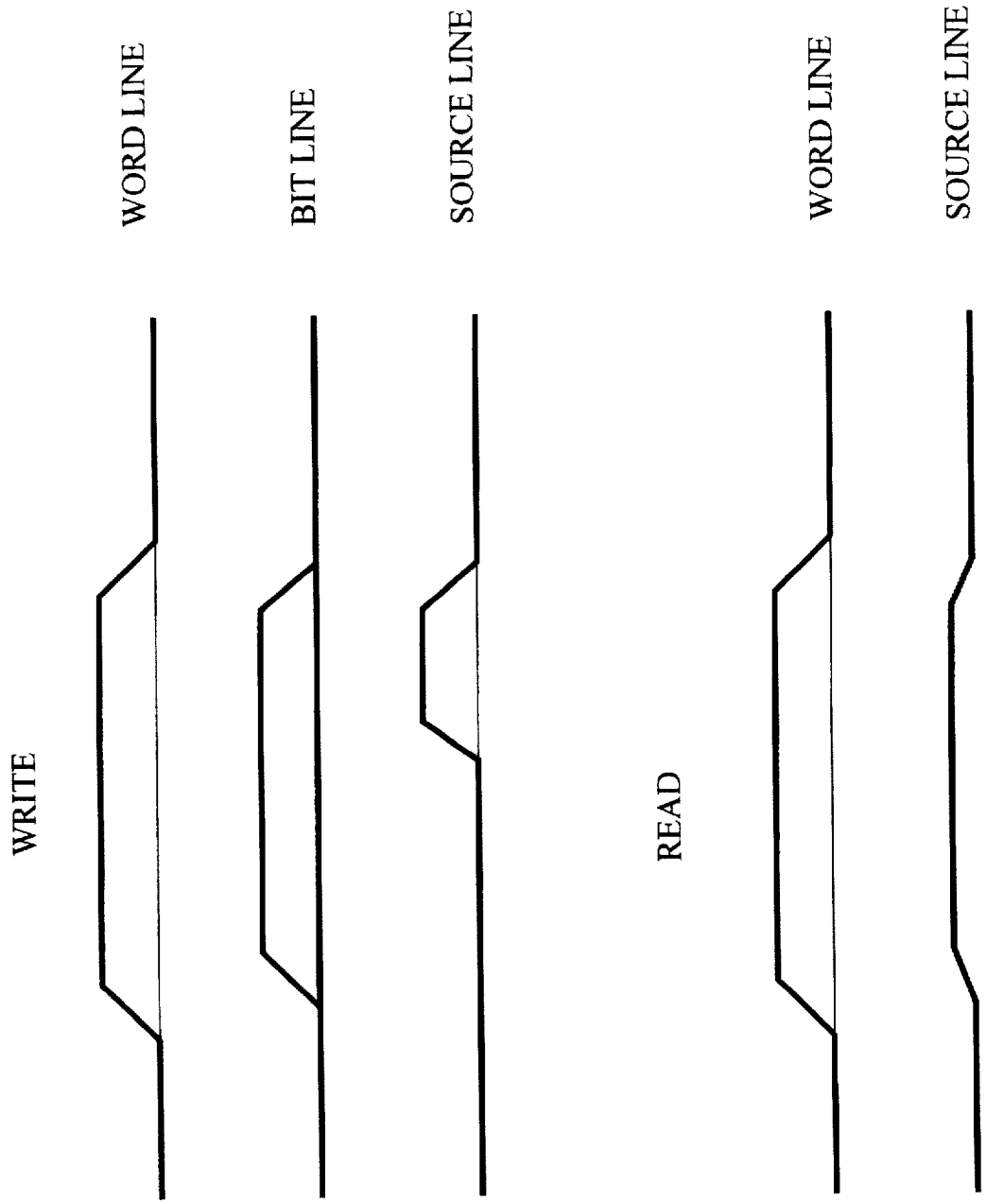
FIG. 7 illustrates the signals used to read and write the data in the word shown in FIG. 6.

The source and word lines are driven by two circuits shown at 125 and 126. Data is written into the word by placing the data on the bit lines as shown in FIG. 7 which illustrates the signals used to read and write the data in the word. It should be noted that during a read operation, the voltage applied to the source line is maintained at a value that is sufficiently small to assure that the data stored in the word will not be altered by the read operation. The current on the bit line is measured to determine the data stored in the ferroelectric FET.

It should also be noted that the selection of a word for reading or writing requires that both the word and source lines be enabled. In the following discussion it will be assumed that the rise time of the pulse on the source line is greater than the RC time constant determined by the resistance of a ferroelectric FET in its high resistance state and the capacitance of the drain to the substrate. If the source line is pulsed and pass transistor 115 is not conducting, no data will be written into the word. As will be explained in detail below, significant savings in the area of a memory made from ferroelectric FETs according to the present invention may be achieved by using both the source and word lines to perform addressing functions.

Implementation of the circuit shown in FIG. 6 is hampered by the finite resistances of the gate and source lines, particularly the gate line. The gate lines are typically constructed from platinum which has a much higher resistivity than aluminum which is used for the metal connections. Platinum is used because it will withstand the high processing temperatures required in the deposition and sintering of the ferroelectric layer. The lines have different resistances and capacitances; hence, pulses that were synchronized when applied at the drivers will travel at different speeds down the source and gate lines and will be out of synchronization by the time the pulses reach the memory cell connected to gate line 111.

The present invention avoids this synchronization problem by capacitively coupling the source and gate lines. The capacitive couplings between these lines will be very high if a large gate electrode is used and the source line is run over the gate line without the introduction of a low dielectric constant insulating layer. Since the ferroelectric layer, which is preferably a PZT layer, has a very high dielectric constant, the source and drain lines are effectively connected for high frequency signals because of the high capacitance between these lines. This capacitive coupling significantly reduces the synchronization problem discussed above.

Figure 8:
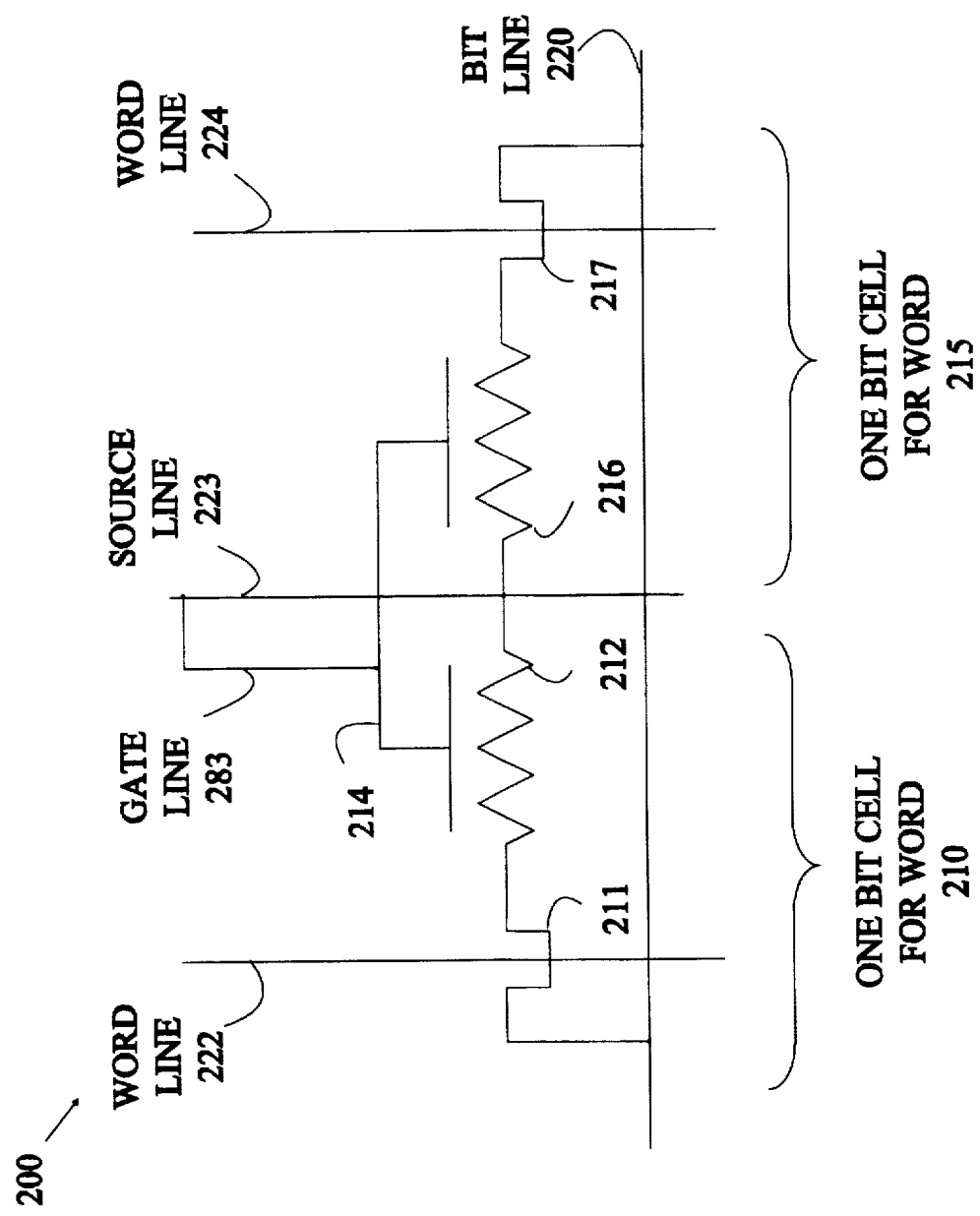
FIG. 8 is a schematic drawing of a two bit memory cell according to the present invention.
Figure 9:
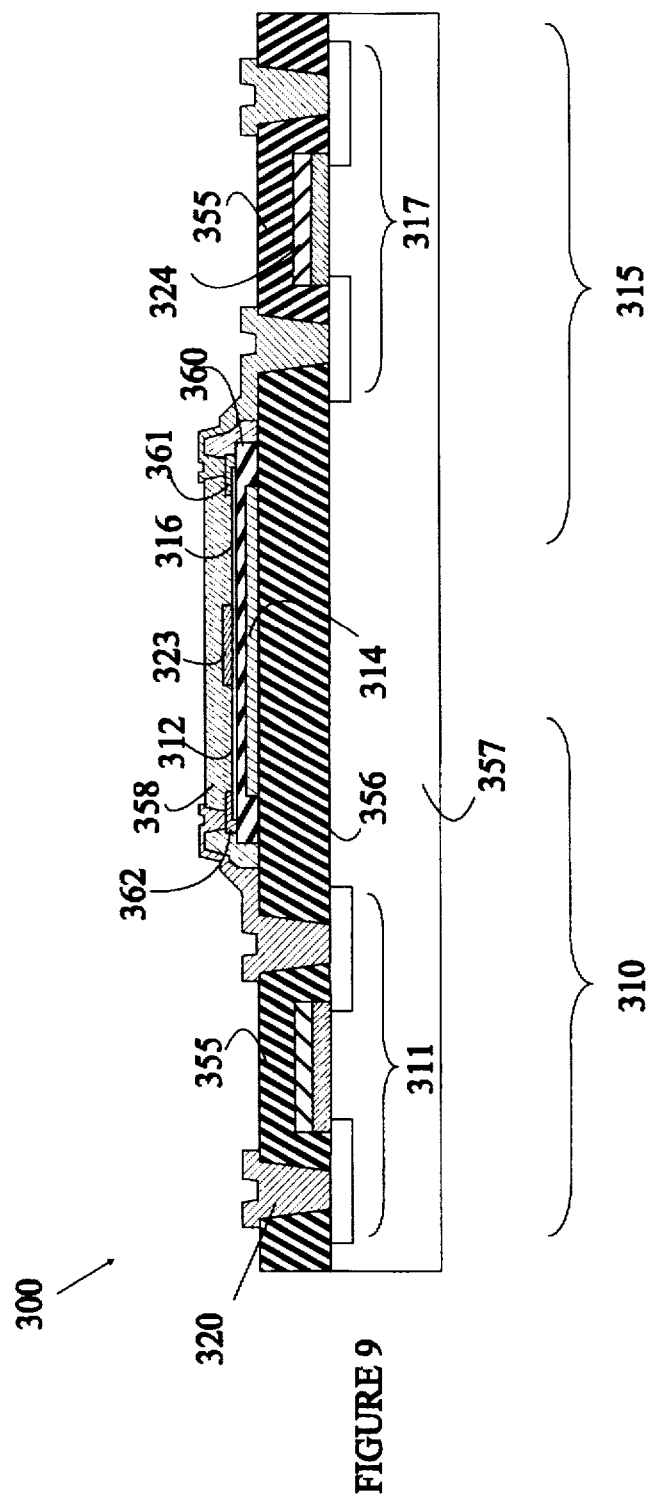
FIG. 9 is a cross-sectional view of a memory cell according to the present invention as it is preferably constructed on a silicon substrate.

The area occupied by each single bit cell can be further reduced by constructing the memory from cells containing two bits in which the source lines of the two bits are shared. Refer now to FIGS. 8 and 9 which illustrate such a two bit memory cell. FIG. 8 is a schematic drawing of a two bit memory cell 200 according to the present invention. FIG. 9 is a cross-sectional view of a two bit memory cell 300 as it is preferably constructed on a silicon substrate. Elements that serve the same function in each drawing having been assigned numbers that differ by 100. Each two-bit memory cell 200 corresponds to two bits in different words connected to the same bit line 220. The bit corresponding to word 210 is constructed from pass transistor 211 and a ferroelectric FET 212 and is selected utilizing word line 222. The bit corresponding to word 215 is constructed from pass transistor 217 and ferroelectric FET 216 and is selected via word line 224. The sources of the two ferroelectric FETs are connected to a source line 223 which is also connected to all of the other FET sources in each of the two words. The gates of the two FETs are constructed from a common electrode as shown at 214. The gates are likewise connected to a common gate line 283 which is connected to the common source line 223 as discussed above.

Refer now to FIG. 9 which is a cross-sectional view through the preferred implementation of a two bit memory cell 300 such as that shown schematically in FIG. 8. Two bit memory cell 300 provides storage for two bits shown at 310 and 315 corresponding to bit cells 210 and 215 shown in FIG. 8. Two bit memory cell 300 is constructed by first constructing the two pass transistors 311 and 317 in a silicon substrate 357 using conventional CMOS fabrication techniques. Pass transistors 311 and 317 and the silicon substrate between these transistors are then covered with a layer of $SiO_2$ 356. The common gate electrode 314 is then deposited on the $SiO_2$ layer and covered with a layer of PZT 360. A patterned semiconductor layer, preferably Indium Oxide, is then deposited on PZT layer 360. The electrodes corresponding to the two drains of the ferroelectric FETs are then deposited together with the electrode corresponding to the common source connection. These electrodes are shown at 361, 362, and 323, respectively. The ferroelectric FET is then covered with a layer of $TiO_2$ and $SiO_2$ as shown at 358. Vias are opened in layers 356 and 358 to provide connections to the source and drain electrodes of the pass transistors and the ferroelectric FETs. A typical via is shown at 320 after being filled with metal. A via is opened to common gate electrode 314 and a second via is opened to common source electrode 323 of the ferroelectric FETs. The two common electrodes are connected using these vias when the metal connecting layer is deposited. However, this via is at the end of the word, and hence, is out of the cross-sectional view shown in the drawing. Similarly, vias are opened in the $SiO_2$ layers shown at 355 to allow connections to be made to the gates of pass transistors 311 and 317. A patterned metal layer is then deposited over the vias to provide the remaining connections.

It will be appreciated from FIG. 9 that the large gate electrode underlying the source electrode provides a high degree of capacitive coupling between the two electrodes. This coupling is enhanced by depositing the electrodes such that they are in electrical contact with the PZT layer. The dielectric constant of the PZT layer is in excess of 100.

Figure 10:
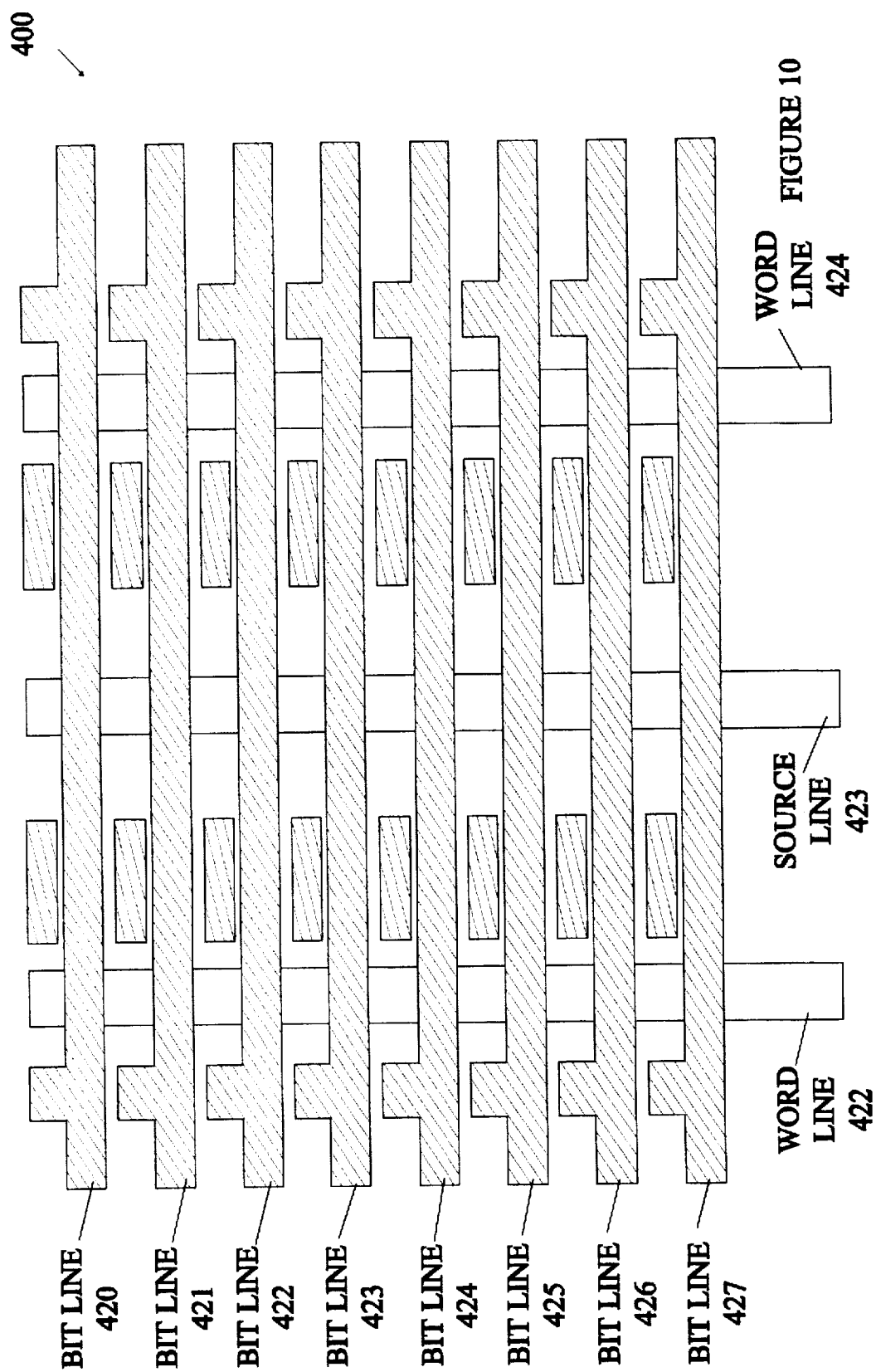
FIG. 10 is a top view of a two word block of memory constructed from two bit memory cells according to the present invention.

Refer now to FIG. 10 which is a top view of a two word block of memory 400 constructed from two bit memory cells such as two bit memory cell 300 discussed above. Each word has bp 8 bits. Each pair of bits is connected to a corresponding bit line. The bit lines are shown at 420–427. Each of the pass transistor gates is connected to a word line which runs at right angles to the bit lines. The two word lines are shown at 422 and 424 respectively. The common source line 423 also runs at right angles to the bit lines. Each of the word lines and the source line are connected to the corresponding underlying electrodes by a single metal connection through a via at one end of the memory block. In the preferred embodiment of the present invention, the ferroelectric layer for each pair of words constructed from two-bit memory cells is common to all of the bits. That is, a single ferroelectric layer is deposited over the area occupied by the words. These three connections lie under the corresponding metal layers, and hence, are not visible in the drawing. The ferroelectric layer must, however, be removed over the pass transistors to allow vias to the CMOS transistors to be opened.

The above described embodiment of memory block 400 utilized a single connection between the source line and the common gate electrode. However any arrangement in which the number of connections between the source line and gate electrode is less than the number of bits in the memory cell provides an advantage in terms of the area occupied by the memory block. For example, a connection could be provided at each end of the gate electrode if the capacitive coupling is not sufficient.

As noted above, both the word line and source lines must be pulsed to write a word into a memory according to the present invention. This observation may be used to further reduce the area needed to construct a memory using the memory cells of the present invention. To obtain the highest density memory, the memory cells are arranged in a rectangular array having a plurality of rows and columns. All of the word lines in a given row are connected together and all of the source lines in each column are connected together. The high order bits of the memory address can then be used to specify the row and the low order bits used to specify the column, or vice versa.

Figure 11:
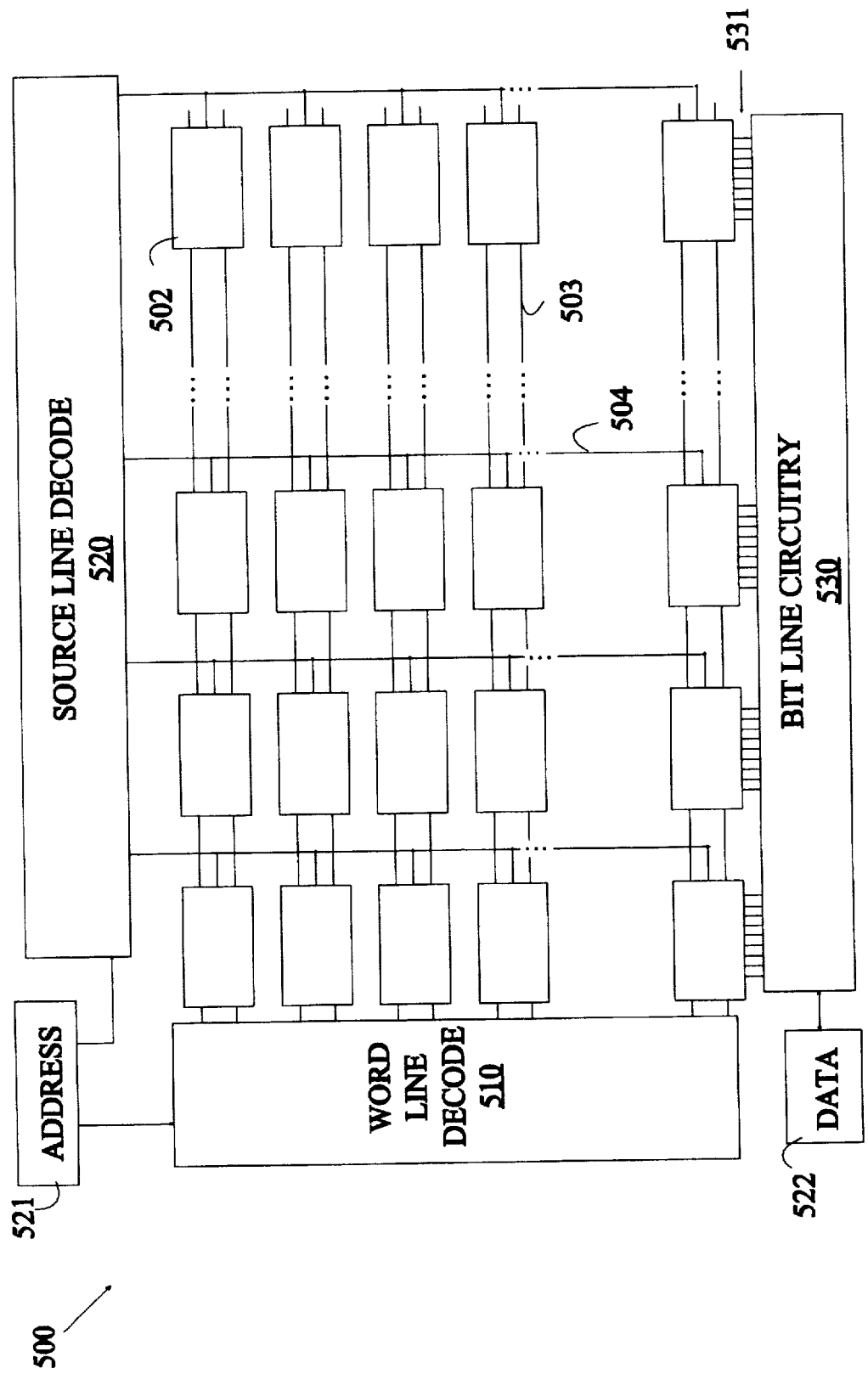
FIG. 11 is a block diagram of a high density memory 500 according to the present invention.

Refer now to FIG. 11 which is a block diagram of a high density memory 500 according to the present invention. Memory 500 is preferably constructed from a plurality of two bit memory cells of which cell 502 is typical. The cells are connected in rows and columns such that all memory cells in a given column are connected to the same vertical metal line via the common source line. A typical source line connection is shown at 504. All of the word lines in each row are connected together. A typical word line connection is shown at 503. A word line decode circuit 510 decodes the high order bits of the address in register 521 to select the correct word line. A source line decode circuit 520 uses the low order bits of the address in register 521 the to select the correct source line. The decode circuits are assumed to include the appropriate drive circuitry in this exemplary circuit. The bit lines from the various words are processed by a bit line multiplexer/demultiplexer shown at 530. The bit lines have been omitted from the drawing to simplify the drawing; however, it is to be understood that bit lines run vertically through all of the columns of bits and terminate in multiplexer 530 as shown at 531. Data in register 522 to be written to the address in register 521 is placed on the appropriate bit lines by circuit 530. Similarly, data that is read from the address is placed in register 522 by circuit 530.

Memory 500 achieves its high density because the space needed between the various columns is only that needed to run the vertical conductors for connection to the source lines. Similarly, the space that must be allocated between each row of memory cells is only that needed to run the horizontal conductors connecting the various word lines to the memory cells. The various drivers have been moved to the edges of the array and are shared by the various words. Hence, no space must be allocated for drive circuitry within the array.

While memory 500 has been described in terms of words constructed from two bit memory cells sharing a common gate electrode and source line, it will be apparent to those skilled in the art that memory 500 could also have been constructed from single bit memory cells. In this case, the connections between the source line and gate electrode can still be made at the end of the word to provide a reduced circuit area. However, such a design would require more circuit area than memory 500, and hence, is not preferred.

Various modifications to the present invention will become apparent to those skilled in the art from the foregoing description and accompanying drawings. Accordingly, the present invention is to be limited solely by the scope of the following claims.

What is claimed is:

1. A circuit for storing a word, said circuit comprising:

N single bit memory cells, wherein N>2, each of said single bit memory cells comprising a pass transistor and a ferroelectric FET, said pass transistor including a pass gate and first and second terminals, said pass transistor providing a conducting path between said first and second terminals in response to said pass gate being coupled to a predetermined potential; and said ferroelectric FET comprising a gate electrode, a layer of ferroelectric material, layer of semiconducting material, a source electrode and a drain electrode, said layer of ferroelectric material being sandwiched between said gate electrode and said layer of semiconducting material, said source and drain electrodes being in contact with said layer of semiconducting material, wherein said drain electrode of said ferroelectric FET is connected to said first terminal of said pass transistor, and wherein all of said gate electrodes in said circuit are connected to a common gate electrode and all of said source electrodes are connected to a common source electrode, said common gate electrode and said common source electrode being connected electrically at less than N points in said circuit.

2. The circuit of claim 1 wherein said ferroelectric layer in each single bit memory cell comprises a portion of a common ferroelectric layer that is shared by all of said ferroelectric FETs, each ferroelectric FET occupying a portion of said common ferroelectric layer with a portion of said ferroelectric layer between said ferroelectric FETs remain unoccupied, and wherein said common gate electrode and said common source electrode comprise conducting layers in contact with said common ferroelectric layer in said unoccupied regions, said common source electrode overlying said common gate electrode in said unoccupied regions.

3. A circuit for storing two words, said circuit comprising:

N two bit memory cells, wherein N>2, each of said two bit memory cells comprising first and second pass transistors and a two bit ferroelectric storage cell, each of said pass transistors including a pass gate and first and second terminals, said pass transistor providing a conducting path between said first and second terminals in response to said pass gate being coupled to a predetermined potential; and said two bit ferroelectric storage cell comprising a gate electrode, a layer of ferroelectric material, a layer of semiconducting material, a source electrode and first and second drain electrodes, said layer of ferroelectric material being sandwiched between said gate electrode and said layer of semiconducting material, said source and drain electrodes being in contact with said layer of semiconducting material, wherein said first drain electrode of said two bit ferroelectric storage cell is connected to said first terminal of said first pass transistor and said second drain electrode of said two bit ferroelectric storage cell is connected to said first terminal of said second pass transistor;

wherein all of said gate electrodes in said circuit are connected to a common gate electrode and all of said source electrodes are connected to a common source electrode.

4. A circuit for storing two words, said circuit comprising:

N two bit memory cells, wherein N>2, each of said two bit memory cells comprising first and second pass transistors and a two bit ferroelectric storage cell, each of said pass transistors including a pass gate and first and second terminals said pass transistor providing a conducting path between said first and second terminals in response to said pass gate being coupled to a predetermined potential; and said two bit ferroelectric storage cell comprising a gate electrode a layer of ferroelectric material, a layer of semiconducting material, a source electrode and first and second drain electrodes, said layer of ferroelectric material being sandwiched between said gate electrode and said layer of semiconducting material, said source and drain electrodes being in contact with said layer of semiconducting material, wherein said first drain electrode of said two bit ferroelectric storage cell is connected to said first terminal of said first pass transistor and said second drain electrode of said two bit ferroelectric storage cell is connected to said first terminal of said second pass transistor;

wherein all of said gate electrodes in said circuit are connected to a common gate electrode and all of said source electrodes are connected to a common source electrode, and wherein said common gate electrode and said common source electrode are connected electrically at less than N points in said circuit.

5. The circuit of claim 3 wherein said ferroelectric layer in each of said two bit ferroelectric storage cells comprises a portion of a common ferroelectric layer, each of said ferroelectric layers of said two bit ferroelectric storage cells being a portion of said common ferroelectric layer with a portion of said ferroelectric layer between said ferroelectric FETs being unoccupied, and wherein said common gate electrode and said common source electrode comprise conducting layers in contact with said common ferroelectric layer in said unoccupied regions, said common source electrode overlying, and being parallel to, said common gate electrode in said unoccupied regions.

6. A memory comprising:

a plurality of word storage cells organized into a rectangular array including a plurality of columns and rows, each of said word storage cells comprising:

a plurality of single bit memory cells, each of said single bit memory cells comprising a pass transistor and a ferroelectric storage element, said pass transistor including a pass gate and first and second terminals, said pass transistor providing a conducting path between said first and second terminals in response to said pass gate being coupled to a predetermined potential; and said ferroelectric storage element comprising a gate electrode, a layer of ferroelectric material, layer of semiconducting material, a source electrode and a drain electrode, said layer of ferroelectric material being sandwiched between said gate electrode and said layer of semiconducting material, said source and drain electrodes being in contact with said layer of semiconducting material, wherein said drain electrode of said ferroelectric storage element is connected to said first terminal of said pass transistor, and wherein all of said gate electrodes in said word storage cell are connected to a common gate electrode and all of said source electrodes in said word storage cell are connected to a common source electrode, said common gate electrode and said common source electrode being connected electrically, wherein all of said common source electrodes in each one of said columns are connected electrically to a column electrode corresponding to that column and all of said pass gates in each of said rows are connected electrically to a row electrode corresponding to that row.

7. A memory comprising:

a plurality of word storage cells organized into a rectangular array including a plurality of columns and rows, each of said word storage cells comprising:

a plurality of single bit memory cells, each of said single bit memory cells comprising a pass transistor and a ferroelectric storage element, said pass transistor including a pass gate and first and second terminals, said pass transistor providing a conducting path between said first and second terminals in response to said pass gate being coupled to a predetermined potential; and said ferroelectric storage element comprising a gate electrode, a layer of ferroelectric material, a layer of semiconducting material, a source electrode and a drain electrode, said layer of ferroelectric material being sandwiched between said gate electrode and said layer of semiconducting material, said source and drain electrodes being in contact with said layer of semiconducting material, wherein said drain electrode of said ferroelectric storage element is connected to said first terminal of said pass transistor, and wherein all of said gate electrodes in said word storage cell are connected to a common gate electrode and all of said source electrodes in said word storage cell are connected to a common source electrode, said common gate electrode and said common source electrode being connected electrically, wherein all of said common source electrodes in each one of said columns are connected electrically to a column electrode corresponding to that column and all of said pass gates in each of said rows are connected electrically to a row electrode corresponding to that row, said memory further comprising:

a circuit for receiving an address comprising a plurality of bits divided into first and second groups of bits;

a circuit for selecting one of said column electrodes, said selection depending on said first group of bits; and a circuit for selecting one of said row electrodes, said selection depending on said second group of bits.

* * * * *

UNITED STATES PATENT AND TRADEMARK OFFICE
CERTIFICATE OF CORRECTION

PATENT NO : 5,789,775
DATED : 08/04/98
INVENTOR(S) : Evans, et al.

It is certified that error appears in the above-identified patent and that said Letters Patent is hereby corrected as shown below:

Column 6, line 58: Delete "bp" after "has"

Column 7, line 43: Delete "the" after "521"

Column 8, line 42: After "layer" replace "with" with - - while - -

Column 8, line 43: After "FETs" replace "remain" with - - remains - -

Column 9, line 13: Insert a comma - - , - - after "terminals"

Column 9, line 18: Insert a comma - - , - - after "electrode"

Signed and Sealed this

Twenty-ninth Day of December, 1998

Attest:

BRUCE LEHMAN

Attesting Officer     Commissioner of Patents and Trademarks